(12) United States Patent
Kim et al.

(10) Patent No.: US 7,663,217 B2
(45) Date of Patent: Feb. 16, 2010

(54) SEMICONDUCTOR DEVICE PACKAGE

(75) Inventors: Byung-Jo Kim, Daegu-si (KR);
Hyung-Lae Eun, Gyeonggi-do (KR);
Sang-Jib Han, Gyeonggi-do (KR)

(73) Assignee: Samsung Electronics Co., Ltd.,
Gyeonggi-Do (KR)

( * ) Notice: Subject to any disclaimer, the term of this patent is extended or adjusted under 35 U.S.C. 154(b) by 127 days.

(21) Appl. No.: 11/936,005

(22) Filed: Nov. 6, 2007

(65) Prior Publication Data

US 2008/0111225 A1 May 15, 2008

(30) Foreign Application Priority Data

Nov. 15, 2006 (KR) .................... 10-2006-0112974

(51) Int. Cl.
*H01L 23/02* (2006.01)
(52) U.S. Cl. ..................... 257/686; 257/672
(58) Field of Classification Search ................ 257/686,
257/687, 723, 779, 780, 788, 795, 777, E25.226,
257/E25.013, E25.018, E25.021, E25.027,
257/E25.085, E21.614
See application file for complete search history.

(56) References Cited

U.S. PATENT DOCUMENTS

| 6,472,746 | B2 | 10/2002 | Taniguchi et al. | |
| 6,777,797 | B2 * | 8/2004 | Egawa | 257/686 |
| 7,230,329 | B2 * | 6/2007 | Sawamoto et al. | 257/686 |
| 7,247,935 | B2 * | 7/2007 | Kawano | 257/686 |
| 7,291,869 | B2 * | 11/2007 | Otremba | 257/107 |
| 7,367,120 | B2 * | 5/2008 | Minamio et al. | 29/848 |
| 7,405,472 | B2 * | 7/2008 | Kawano | 257/686 |
| 2003/0193080 | A1 * | 10/2003 | Cabahug et al. | 257/666 |
| 2005/0098869 | A1 * | 5/2005 | Shiozawa | 257/686 |
| 2005/0161793 | A1 * | 7/2005 | Ohno et al. | 257/686 |

FOREIGN PATENT DOCUMENTS

| JP | 2002-50737 | 2/2002 |
| JP | 2002-289769 | 10/2002 |
| JP | 2003-007972 | 1/2003 |
| KR | 2002-0053661 | 7/2002 |
| KR | 10-2005-0104960 | 11/2005 |

OTHER PUBLICATIONS

English language abstract of Japanese Publication No. 2002-50737.
English language abstract of Japanese Publication No. 2002-289769.
English language abstract of Korean Publication No. 10-2005-0104960.

* cited by examiner

*Primary Examiner*—Thao P. Le
(74) *Attorney, Agent, or Firm*—Myers Bigel Sibley & Sajovec, P.A.

(57) ABSTRACT

Provided is a semiconductor device package. The semiconductor device package includes: stacked semiconductor chips having bonding pads; a PCB (printed circuit board) mounting the stacked semiconductor chips thereon, and including bonding electrodes that correspond to the bonding pads; and interposers respectively covering the stacked semiconductor chips and interposed between the stacked semiconductor chips. The interposers comprise wire patterns connecting the bonding pads with the bonding electrodes, and connecting the interposers to each other.

20 Claims, 4 Drawing Sheets

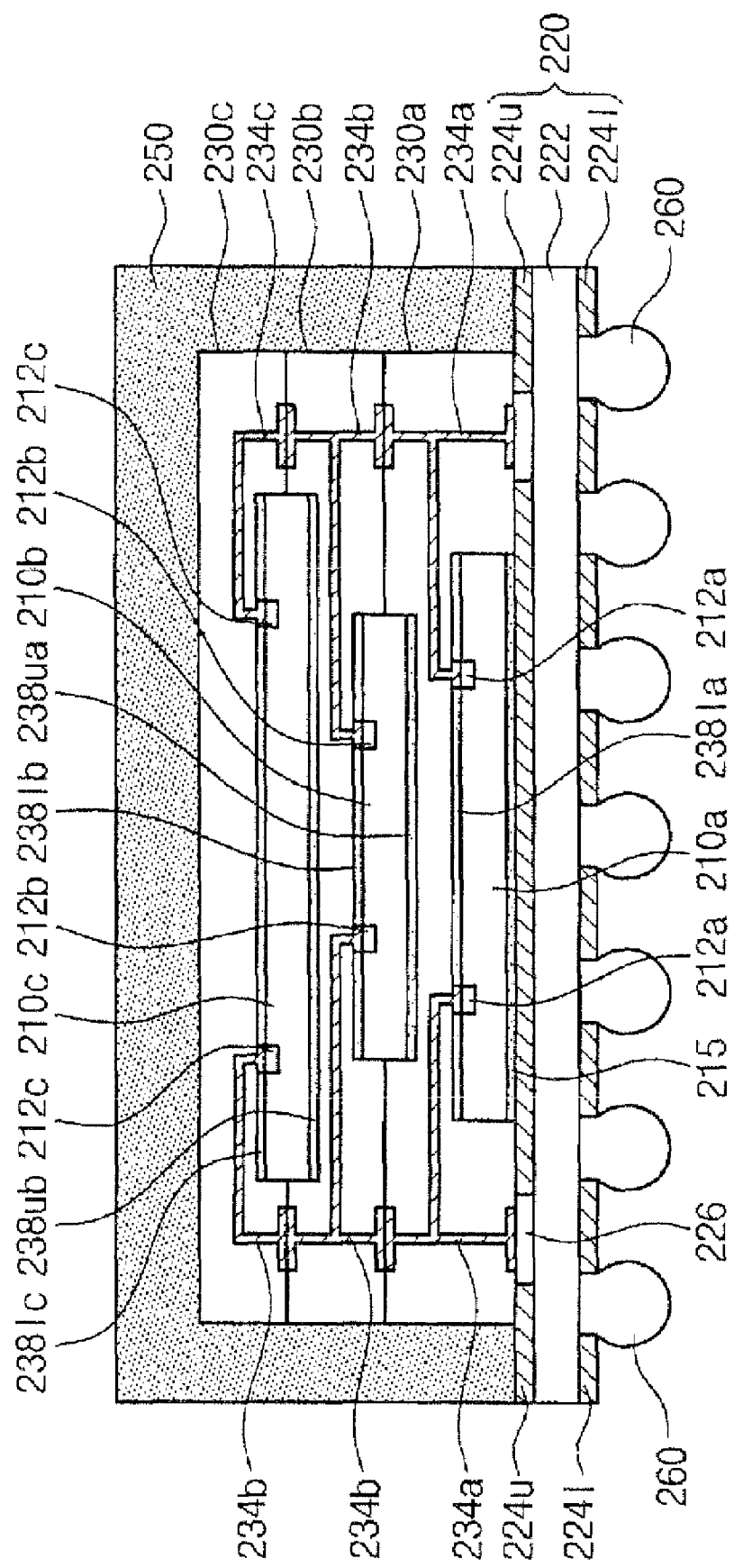

SEMICONDUCTOR DEVICE PACKAGE

CROSS-REFERENCE TO RELATED APPLICATIONS

This U.S. non-provisional patent application claims priority under 35 U.S.C. § 119 to Korean Patent Application No. 10-2006-112974, filed on Nov. 15, 2006, the entire contents of which are hereby incorporated by reference.

BACKGROUND

1. Technical Field

The present invention disclosed herein relates to a semiconductor device package, and more particularly, to a semiconductor chip stacked package.

2. Description of the Related Art

Packaging technology for integrated circuits has been under continual development to meet requirements for miniaturization and packaging reliability in the semiconductor industry. For example, the requirement for miniaturization has accelerated technological progress related to a package having a size close to that of a semiconductor chip, sometimes referred to as a chip scale package (CSP). Moreover, the packaging reliability requirement raises the importance of a packaging technology that is capable of improving the efficiency of packaging processes and the mechanical and electrical reliability after packaging.

Also, as further miniaturization and higher performance of electronic equipment is required, various technologies are under development to provide high-capacity semiconductor products. One method of providing the high-capacity semiconductor products includes improving the capacity of a memory chip, i.e., providing a high degree of integration in the memory chip. A higher number of cells is directly integrated in the limited space of the semiconductor chip to achieve the high degree of integration.

However, the high degree of integration in the memory chip requires the use of more advanced technology, including a very accurate and fine line width, and a greater time for development. Accordingly, stacking technology has been proposed as another method to provide high-capacity semiconductor products.

The term "stack" in the semiconductor industry refers to stacking at least two semiconductor chips or semiconductor device packages. According to the stacking technology, a 128 MB dynamic random access memory (DRAM) may include two stacked 64 MB DRAM, or a 256 DRAM may include two stacked 128 MB DRAM. Additionally, the stacked semiconductor device packages have advantages including increased memory capacity, mounting density, and efficiency of mounting density and mounting area usage. Accordingly, research and development related to the stacked semiconductor device package has been increasing.

FIGS. 1 and 2 are cross-sectional views of a conventional semiconductor device package.

Referring to FIG. 1, a semiconductor device package includes stacked semiconductor chips 10a, 10b, and 10c, a printed circuit board (PCB) 20, bonding wires 35a, 35b, and 35c, a molding material 50, and solder balls 60.

The stacked semiconductor chips 10a, 10b, and 10c may respectively include bonding pads 12a, 12b, and 12c at active regions of their upper surfaces. Adhesive materials 40a and 40b are provided between the stacked semiconductor chips 10a, 10b, and 10c for adhesion therebetween. The stacked semiconductor chips 10a, 10b, and 10c may be mounted on the PCB 20 with an upper insulation layer pattern 24u using a mounting adhesive material 15.

The PCB 20 has a main body of a core material 22, and includes the upper insulation layer pattern 24u with bonding electrodes 26 and a lower insulation layer pattern 24l. The PCB 20 may include the bonding electrodes 26 corresponding to the bonding pads 12a, 12b, and 12c at an upper part.

The bonding wires 35a, 35b, and 35c may electrically connect the bonding pads 12a, 12b, and 12c with the corresponding bonding electrodes 26. The molding material 50 seals the PCB 20, the stacked semiconductor chips 10a, 10b, and 10c, and the bonding wires 35a, 35b, and 35c. The solder balls 60 disposed at a lower part of the PCB 20 are connected to an inner wire (not shown) of the PCB 20 such that connection for an external circuit such as a system board can be provided. Reference number 37 represents a connection ball that is formed during a wire bonding process in order to electrically connect the bonding pads 12a, 12b, and 12c with the corresponding bonding electrodes 26.

The above semiconductor device package has a structure in which the semiconductor chips 10a, 10b, and 10c having substantially the same size are stacked therein. There may be a spacer or an interposer in addition to the adhesive materials 40a and 40b between the stacked semiconductor chips 10a, 10b, and 10c. Furthermore, due to the bonding wires 35a, 35b, and 35c that electrically connect the bonding pads 12a, 12b, and 12c with the bonding electrodes 26, a minimum interval is required between the stacked semiconductor chips 10a, 10b, and 10c in order to accommodate the wires. Accordingly, this places a limitation on the ability to reduce the thickness of the semiconductor device package.

Referring to FIG. 2, a semiconductor device package includes stacked semiconductor chips 10d, 10e, and 10f, a PCB 20, bonding wires 35a, 35b, and 35c, a molding material 50, and solder balls 60.

The semiconductor chips 10d, 10e, and 10f may respectively include bonding pads 12d, 12e, and 12f at active regions of their upper surfaces. Adhesive materials 40c and 40d are provided between the stacked semiconductor chips 10d, 10e, and 10f for adhesion therebetween. The stacked semiconductor chips 10d, 10e, and 10f may be mounted on the PCB 20 with an upper insulation layer pattern 24u using a mounting adhesive material 15.

The PCB 20 has a main body of a core material 22 and includes the upper insulation layer pattern 24u with bonding electrodes 26 and a lower insulation layer pattern 24l. The PCB 20 may include the bonding electrodes 26 corresponding to the bonding pads 12d, 12e, and 12f at an upper part. The bonding pads 12d, 12e, and 12f and the bonding electrodes 26 may be electrically and sequentially connected or the bonding pads 12d, 12e, and 12f may be electrically connected to the bonding electrodes 26.

The bonding wires 35a, 35b, and 35c may electrically connect the bonding pads 12d, 12e, and 12f with the corresponding bonding electrodes 26. The molding material 50 seals the PCB 20, the stacked semiconductor chips 10d, 10e, and 10f, and the bonding wires 35a, 35b, and 35c. The solder balls 60 disposed at a lower part of the PCB 20 are connected to an inner wire (not shown) of the PCB 20 such that connection for an external circuit such as a system board can be provided. Reference number 37 represents a connection ball that is formed during a wire bonding process in order to electrically connect the bonding pads 12d, 12e, and 12f with the corresponding bonding electrodes 26.

The above semiconductor device package has a structure in which the semiconductor chips 10d, 10e, and 10f, having the respectively different sizes, are stacked therein. The sizes of the stacked semiconductor chips 10d, 10e, and 10f decrease from a lower part toward an upper part of the package. Unlike FIG. 1, there are only adhesive materials 40c and 40d between the stacked semiconductor chips 10d, 10e, and 10f. Accordingly, intervals between the stacked semiconductor chips 10d, 10e, and 10f are small compared to FIG. 1. However, the stacked semiconductor chips 10d, 10e, and 10f have sizes that decrease from the lower part toward the upper part such that mounting density of the semiconductor device package and the efficiency of mounting area usage are decreased.

The above described semiconductor device packages have a structure in which the bonding pads of the semiconductor chips are electrically connected to the bonding electrodes of the PCB through the bonding wires. Therefore, there is a limitation in stacking the semiconductor chips due to loop heights of the bonding wires. Furthermore, since intervals between the semiconductor chips are necessary, the thickness of the semiconductor device package increases as the number of stacked semiconductor chips is increased. Additionally, defects such as shorts between the bonding wires, opens of the bonding wires, shorts between the bonding wires and the adjacent bonding pads, and cracks of the semiconductor chips may occur during a wire bonding process. Furthermore, sweeping of the bonding wires may occur during a molding process. The present invention addresses these and other disadvantages of the conventional art.

SUMMARY

The present invention provides a semiconductor device package with reduced thickness. The present invention also provides a semiconductor device package in which semiconductor chips having respectively different sizes are stacked therein.

Embodiments of the present invention provide semiconductor device packages including: a plurality of stacked semiconductor chips having bonding pads; a PCB (printed circuit board) including bonding electrodes, wherein the stacked semiconductor chips are mounted on the PCB; and interposers covering each of the stacked semiconductor chips and interposed between the stacked semiconductor chips. The interposers comprise wire patterns connecting the bonding pads with the bonding electrodes, and connecting the interposers to each other.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIGS. 4A and 4B are cross-sectional views of a semiconductor device package according to some embodiments of the present invention.

DETAILED DESCRIPTION

Figure 1:
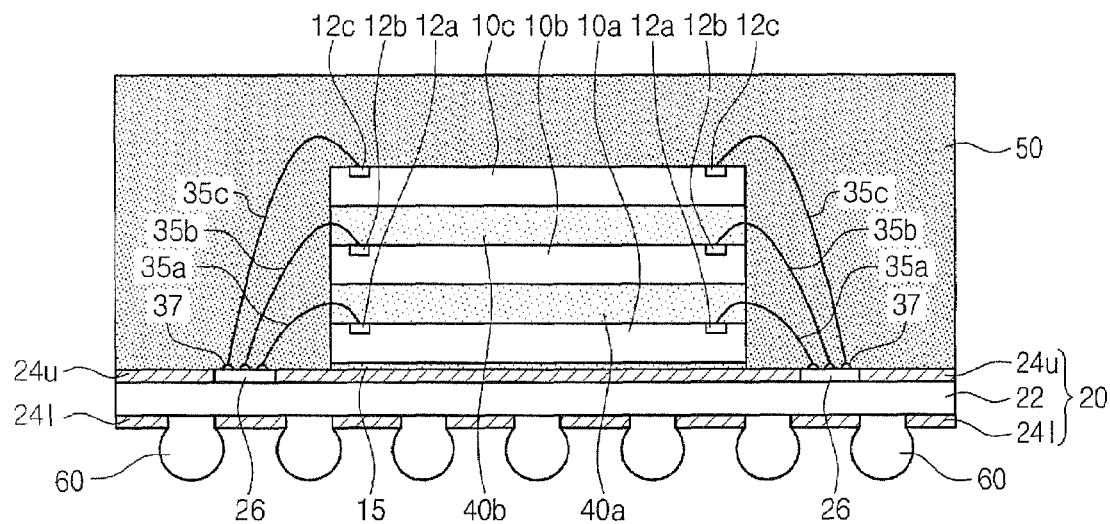
FIGS. 1 and 2 are cross-sectional views of a conventional semiconductor device package.
Figure 2:
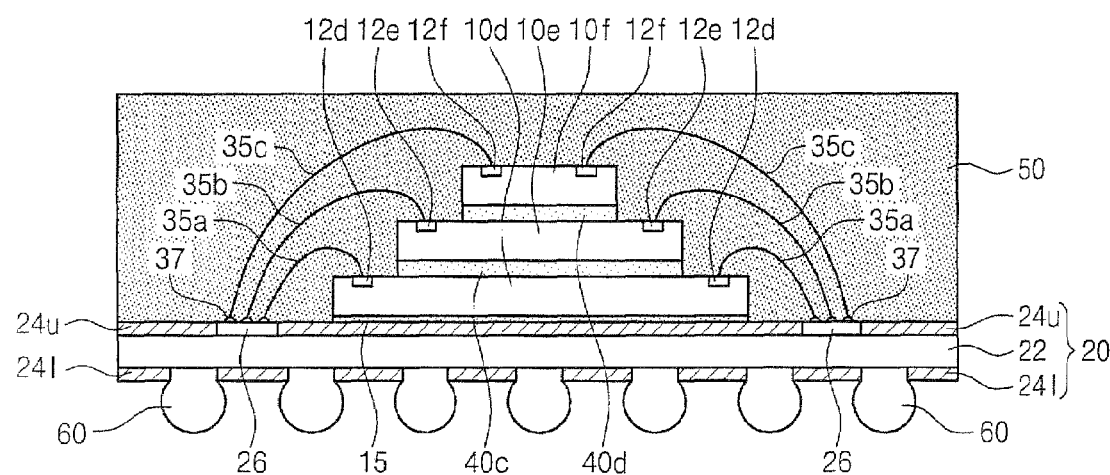

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Figure 3A:
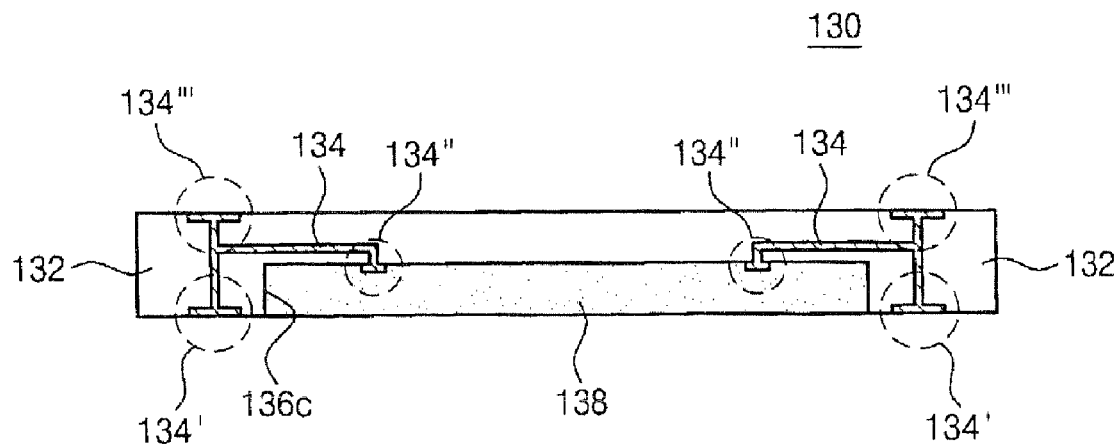
FIGS. 3A and 3B are cross-sectional views of an interposer according to some embodiments of the present invention.
Figure 3B:
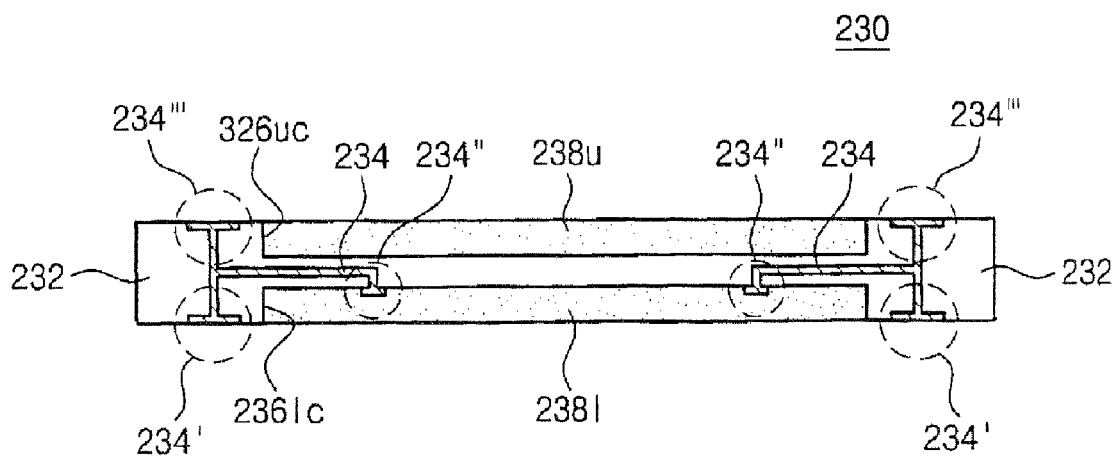

FIGS. 3A and 3B are cross-sectional views of an interposer according to some embodiments of the present invention.

Referring to FIG. 3A, an interposer 130 includes an insulation material 132 and a wire pattern 134. The wire pattern 134 in the insulation material 132 connects bonding pads, which are provided on an active region of a semiconductor chip, to bonding electrodes disposed on an upper part of a PCB.

The interposer 130 may have one of a substrate type, a tape type, and a film type. The wire pattern 134 in the interposer 130 includes lower connection parts 134', bonding pad connection parts 134", and upper connection parts 134'" to be electrically connected to the bonding electrodes on the upper surface of the PCB, the bonding pads of the semiconductor chip, and another interposer (not shown) stacked on the upper part, respectively. The wire pattern 134 may include a conductive material.

The interposer 130 may include a cavity 136c, which is matched to the size of the semiconductor chip, in order to cover the semiconductor chip. The bonding pad connection parts 134" of the wire patterns 134 corresponding to the bonding pads of the semiconductor chip may protrude into the cavity 136c. The cavity 136c may further include a capping adhesive material 138. The capping adhesive material 138 is filled in the cavity 136c or may be provided in a layer type according to the profile of the cavity 136c. The capping adhesive material 138 may be an adhesive material that can be displaced during a process of adhering the interposer 130 to the semiconductor chip.

Referring to FIG. 3B, an interposer 230 includes an insulation material 232 and a wire pattern 234. The wire pattern 234 in the insulation material 232 connects bonding pads, which are provided on an active region of a semiconductor chip, with bonding electrodes disposed on an upper part of a PCB.

The interposer 230 may have one of a substrate type, a tape type, and a film type. The wire patterns 234 in the interposer 230 include lower connection parts 234', bonding pad connection parts 234", and upper connection parts 234'" in order to be electrically connected to the bonding electrodes on the upper surface of the PCB, the bonding pads of the semiconductor chip, and another interposer (not shown) stacked on the upper part, respectively. The wire pattern 234 may include a conductive material.

The interposer 230 includes lower and upper cavities 236lc and 236uc, which are matched to the sizes of respective semiconductor chips that are adhered to a lower part and an upper part, such that the respective semiconductor chips can be installed to the lower part and the upper part. The bonding pad connection parts 234" of the wire pattern 234 correspond to the bonding pads of the semiconductor chip adhered to the lower part and may protrude into the lower cavity 236*lc*. The lower and upper cavities 236*lc* and 236*uc* further include lower and upper cohesive materials 238*l* and 238*u*. The lower and upper cohesive materials 238*l* and 238*u* may be respectively filled in the lower and upper cavities 236*lc* and 236*uc*, or may be respectively provided in a layer type according to the profile of the lower and upper cavities 236*lc* and 236*uc*. The lower and upper cohesive materials 238*l* and 238*u* may be an adhesive material that can be displaced during a process of adhering the interposer 230 to the semiconductor chips.

Figure 4A:
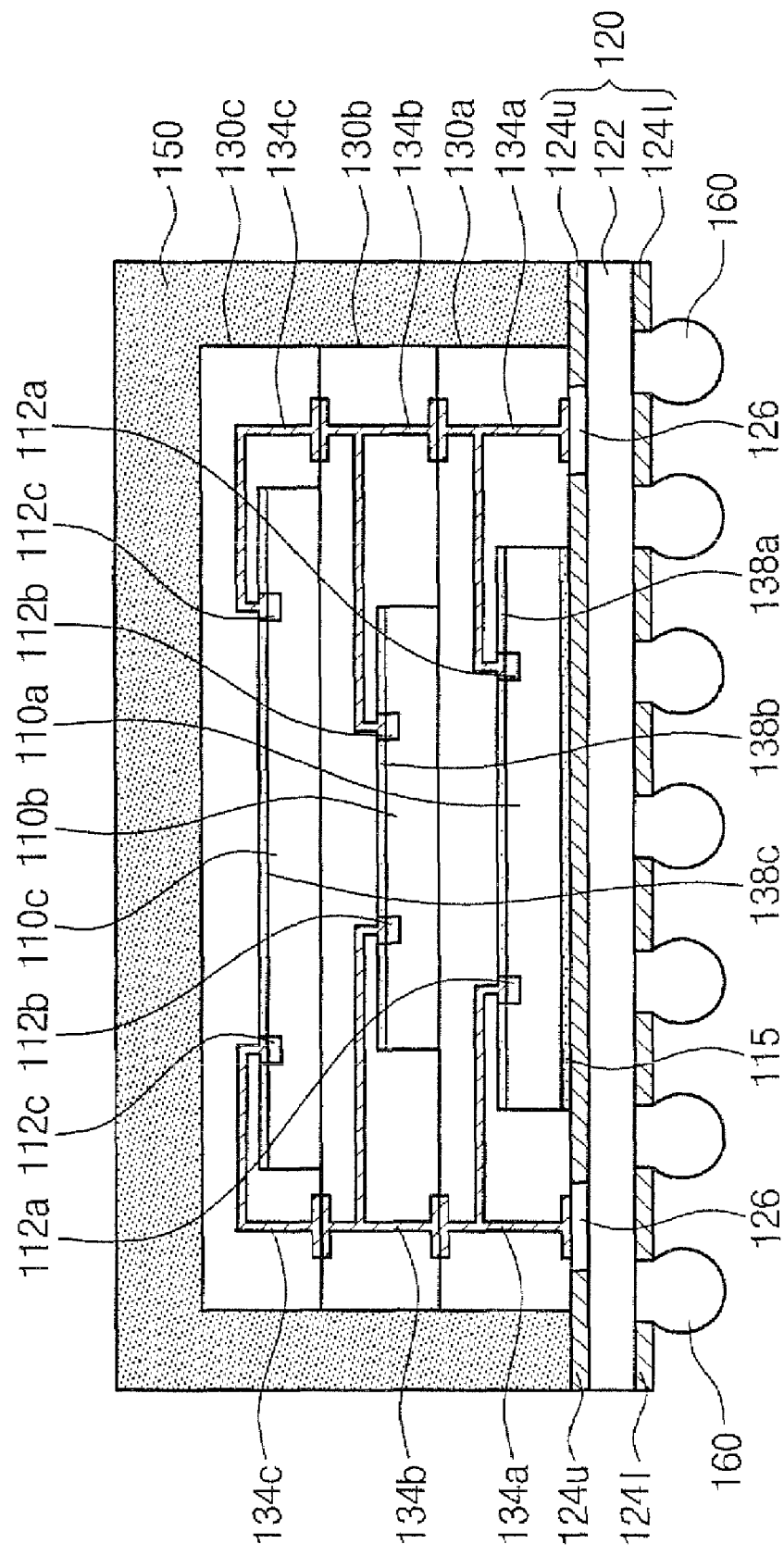

FIGS. 4*a* and 4B are cross-sectional views of a semiconductor device package according to some embodiments of the present invention.

Referring to FIG. 4A, the semiconductor device package includes stacked semiconductor chips 110*a*, 110*b*, and 110*c*, a PCB 120, interposers 130*a*, 130*b*, and 130*c*, a molding material 150, and solder balls 160.

The stacked semiconductor chips 110*a*, 110*b*, and 110*c* may include respective bonding pads 112*a*, 112*b*, and 112*c* at active regions of their upper parts. The lowest semiconductor chip 110*a* may be mounted on the PCB 120 with the upper insulation layer pattern 124*u* using a mounting adhesive material 115. The stacked semiconductor chips 110*a*, 110*b*, and 110*c* may have substantially the same size or respectively different sizes.

The PCB 120 has a main body of a core material 122 and includes the upper insulation layer pattern 124*u* with bonding electrodes 126 and a lower insulation layer pattern 124*l*. The upper and lower insulation layer patterns 124*u* and 124*l* may be a photo solder resist (PSR). The PCB 120 includes bonding electrodes 126 corresponding to bonding pads 112*a*, 112*b*, and 112*c* at the upper part thereof. The bonding pads 112*a*, 112*b*, and 122*c* may be electrically connected to the corresponding bonding electrodes 126.

The interposers 130*a*, 130*b*, and 130*c* may be provided between the stacked semiconductor chips 110*a*, 110*b*, and 110*c*. The interposers 130*a*, 130*b*, and 130*c* include the insulation material 132 of FIG. 3*a*, and wire patterns 134*a*, 134*b*, and 134*c*. The wire patterns 134*a*, 134*b*, and 134*c* in the insulation material 132 connect the bonding pads 112*a*, 112*b*, and 112*c* with the bonding electrodes 126. The bonding pads 112*a*, 112*b*, and 112*c* are respectively provided at the active regions of the semiconductor chips 110*a*, 110*b*, and 110*c*. The bonding electrodes 126 are provided at the upper part of the PCB 120. The wire patterns 134*a*, 134*b*, and 134*c* in the interposers 130*a*, 130*b*, and 130*c* are electrically connected to each other such that the bonding pads 112*a*, 112*b*, and 112*c* of the stacked semiconductor chips 110*a*, 110*b*, and 110*c* may be electrically connected to the corresponding bonding electrodes 126.

The interposers 130*a*, 130*b*, and 130*c* include cavities that are matched to the sizes of the respective semiconductor chips 110*a*, 110*b*, and 110*c*, such that the stacked semiconductor chips 110*a*, 110*b*, and 110*c* can be adhered at the lower part of the interposers 130*a*, 130*b*, and 130*c*. The bonding pad connection parts 134″ of FIG. 3*a* of the wire patterns 134*a*, 134*b*, and 134*c* corresponding to the bonding pads 112*a*, 112*b*, and 112*c* of the stacked semiconductor chips 110*a*, 110*b*, and 110*c* may protrude into the cavities. The cavities may further include capping adhesive materials 138*a*, 138*b*, and 138*c*. The capping adhesive materials 138*a*, 138*b*, and 138*c* may be filled in the cavities, or may be provided in a layer type according to the profile of the cavities. The capping adhesive materials 138*a*, 138*b*, and 138*c* may be an adhesive material that can be displaced during a process of adhering the interposers 130*a*, 130*b*, and 130*c* to the respective semiconductor chips 110*a*, 110*b*, and 110*c*. Accordingly, the bonding pads 112*a*, 112*b*, and 112*c* of the stacked semiconductor chips 110*a*, 110*b*, and 110*c* may be stably connected to the wire patterns 134*a*, 134*b*, and 134*c* of the interposers 130*a*, 130*b*, and 130*c*. Additionally, an adhesive material (not shown) may be further included between the interposers 130*a*, 130*b*, and 130*c*.

The molding material 150 may seal the PCB 120, the stacked semiconductor chips 110*a*, 110*b*, and 110*c*, and the interposers 130*a*, 130*b*, and 130*c*. The molding material 150 may be an Epoxy Molding Compound (EMC). The solder balls 160 provided at the lower part of the PCB 120 are connected to an inner wire (not shown) of the PCB 120 such that it can be connected to an external circuit such as a system board.

Referring to FIG. 4B, the semiconductor device package includes stacked semiconductor chips 210*a*, 210*b*, and 210*c*, a PCB 220, interposers 230*a*, 230*b*, and 230*c*, a molding material 250, and solder balls 260.

The stacked semiconductor chips 210*a*, 210*b*, and 210*c* may include respective bonding pads 212*a*, 212*b*, and 212*c* at active regions of their upper parts. The lowest semiconductor chip 210*a* may be mounted on the PCB 220 with the upper insulation layer pattern 224*u* using a mounting adhesive material 215. The stacked semiconductor chips 210*a*, 210*b*, and 210*c* may have substantially the same size or respectively different sizes.

The PCB 220 has a main body of a core material 222 and includes the upper insulation layer pattern 224*u* with bonding electrodes 226 and a lower insulation layer pattern 224*l*. The upper and lower insulation layer patterns 224*u* and 224*l* may be a PSR. The PCB 220 includes the upper insulation layer pattern 224*u* and bonding electrodes 226 corresponding to bonding pads 212*a*, 212*b*, and 222*c* at the upper part thereof. The bonding pads 212*a*, 212*b*, and 212*c* may be electrically connected to the corresponding bonding electrodes 226.

The interposers 230*a*, 230*b*, and 230*c* may be provided between the stacked semiconductor chips 210*a*, 210*b*, and 210*c*. The interposers 230*a*, 230*b*, and 230*c* include the insulation material 232 of FIG. 3*b*, and wire patterns 234*a*, 234*b*, and 234*c*. The wire patterns 234*a*, 234*b*, and 234*c* in the insulation material 232 connect the bonding pads 212*a*, 212*b*, and 212*c* with the bonding electrodes 226. The bonding pads 212*a*, 212*b*, and 212*c* are respectively provided at the active regions of the semiconductor chips 210*a*, 210*b*, and 210*c*. The bonding electrodes 226 are provided at the upper part of the PCB 220. The wire patterns 234*a*, 234*b*, and 234*c* in the interposers 230*a*, 230*b*, and 230*c* are electrically connected to each other such that the bonding pads 212*a*, 212*b*, and 212*c* of the stacked semiconductor chips 210*a*, 210*b*, and 210*c* may be electrically connected to the corresponding bonding electrodes 226.

The interposers 230*a*, 230*b*, and 230*c* include lower and upper cavities that are matched to the sizes of the respective semiconductor chips 210*a*, 210*b*, and 210*c*, such that the stacked semiconductor chips 210*a*, 210*b*, and 210*c* can be adhered at the lower and upper parts of the interposers 230*a*, 230*b*, and 230*c*. The bonding pad connection parts 234″ of FIG. 3*b* of the wire patterns 234*a*, 234*b*, and 234*c* corresponding to the bonding pads 212*a*, 212*b*, and 212*c* of the respective semiconductor chips 210*a*, 210*b*, 210*c* may protrude into the lower cavities. The lower and upper cavities, respectively, may further include lower and upper cohesive materials 238*la*, 238*lb*, 238*lc*, 238*ua*, and 238*ub*. The lower and upper cohesive materials 238*la*, 238*lb*, 238*lc*, 238*ua*, and 238*ub* may be respectively filled in the lower and upper cavities, or may be provided in a layer type according to the profile of the lower and upper cavities. The lower and upper cohesive materials 238la, 238lb, 238lc, 238ua, and 238ub may be an adhesive material that can be displaced during a process of adhering the respective semiconductor chips 210a, 210b, and 210c to the interposers 230a, 230b, and 230c. Accordingly, the bonding pads 210a, 210b, and 210c of the respective semiconductor chips 210a, 210b, and 210c are stably connected to the wire patterns 234a, 234b, and 234c of the interposers 230a, 230b, and 230c. Additionally, an adhesive material (not shown) may be further included between the interposers 230a, 230b, and 230c.

The molding material 250 may seal the PCB 220, the stacked semiconductor chips 210a, 210b, and 210c, and the interposers 230a, 230b, and 230c. The molding material 250 may be an EMC. The solder balls 260 provided at the lower part of the PCB 220 are connected to an inner wire (not shown) of the PCB 220 such that it can be connected to an external circuit such as a system board.

The stacked chip semiconductor device package according to some embodiments of the present invention has a structure in which the bonding pads of the semiconductor chips are connected to the bonding electrodes of the PCB through the wire patterns inside the interposers. Therefore, unlike the conventional method, a limitation caused by the loop height of the bonding wires does not occur in a process of stacking the semiconductor chips. Moreover, the interposer is manufactured to be slim, such that the thickness of the stacked chip semiconductor device package can be reduced. Also, unlike the conventional method, a wire bonding process is not used, so that defects such as shorts between the bonding wires, opens of the bonding wires, shorts between bonding wires and adjacent bonding pads, and cracks of the semiconductor chips do not occur during a wire bonding process. Sweeping of the bonding wires also does not occur during a molding process. Furthermore, since the semiconductor chips are stacked using the interposers, the mechanical and electrical reliability of the semiconductor device package may be improved. Therefore, the present invention provides a semiconductor device package capable of improving the packaging density and the efficiency of the packaging area usage.

The stacked chip semiconductor device package according to some embodiments of the present invention has a structure in which the bonding pads of the semiconductor chips are connected to the bonding electrodes of the PCB through the wire patterns inside the interposers. Therefore, unlike the conventional structure in which the semiconductor chips having the respectively different sizes are stacked with a predetermined form, various structures can be applied to stack the semiconductor chips. Accordingly, embodiments of the present invention provide a semiconductor device package capable of packaging various semiconductor chips.

Embodiments of the present invention provide semiconductor device packages including: a plurality of stacked semiconductor chips having bonding pads; a PCB (printed circuit board) including bonding electrodes, wherein the stacked semiconductor chips are mounted on the PCB; and interposers covering each of the stacked semiconductor chips and interposed between the stacked semiconductor chips. The interposers comprise wire patterns connecting the bonding pads with the bonding electrodes, and connecting the interposers to each other.

According to some embodiments, the semiconductor chips have substantially the same size.

According to other embodiments, the semiconductor chips have respectively different sizes.

In some embodiments, the interposers further comprise an insulation material. The interposers may comprise one of a substrate type, a tape type, and a film type.

In other embodiments, the interposers comprise a cavity at their lower part. The cavity corresponds to the sizes of the stacked semiconductor chips. The cavity further includes an adhesive material.

In yet other embodiments, the interposers comprise respective cavities at a lower part and an upper part thereof. The cavities correspond to the sizes of the semiconductor chips. The cavities further comprise an adhesive material.

In further embodiments, the wire pattern comprises a conductive material.

In still further embodiments, the semiconductor device package includes a molding material that seals the semiconductor chips, the interposers, and the upper part of the PCB. The molding material is EMC.

In even further embodiments, the semiconductor device package further includes conductive balls provided in the lower part of the PCB.

Some embodiments of the present invention provide an interposer, comprising: an insulation material; a wire pattern in the insulation material, the wire pattern including: lower connection parts configured to be electrically connected to bonding electrodes of a substrate; bonding pad connection parts configured to be electrically connected to bonding pads of a semiconductor chip; and upper connection parts configured to be electrically connected to another interposer; and one or more cavities disposed in the insulation material, wherein at least a portion of the bonding pad connection parts is exposed in the cavities.

According to some embodiments, the one or more cavities comprise a single cavity disposed in a lower part of the insulation material.

According to other embodiments, the one or more cavities comprise a first cavity disposed in a lower part of the insulation material and a second cavity disposed in an upper part of the insulation material. The portion of the bonding pad connection parts may only be exposed by the first cavity.

According to some embodiments, the interposer may further include a capping adhesive material disposed in the cavities.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor device package comprising:
   a plurality of stacked semiconductor chips, each of the semiconductor chips having bonding pads, an upper surface, and side surfaces;
   a PCB (printed circuit board) including bonding electrodes, wherein the plurality of stacked semiconductor chips are mounted on the PCB; and
   interposers respectively covering the substantially entire upper surfaces and at least portions of the side surfaces of the stacked semiconductor chips such that the interposers are interposed between the stacked semiconductor chips,
   wherein the interposers comprise wire patterns connecting the bonding pads with the bonding electrodes, and connecting the interposers to each other.

2. The semiconductor device package of claim 1, wherein the semiconductor chips have substantially the same size.

3. The semiconductor device package of claim 1, wherein the semiconductor chips have respectively different sizes.

4. The semiconductor device package of claim 1, wherein the interposers further comprise an insulation material.

5. The semiconductor device package of claim 4, wherein the interposers comprise one of a substrate type, a tape type, and a film type.

6. The semiconductor device package of claim 5, wherein each of the interposers comprises a cavity at a lower part thereof.

7. The semiconductor device package of claim 6, wherein the cavity corresponds to the size of the stacked semiconductor chip covered by the interposer.

8. The semiconductor device package of claim 6, wherein the cavity further comprises an adhesive material.

9. The semiconductor device package of claim 5, wherein each of the interposers comprises cavities at a lower part and an upper part thereof.

10. The semiconductor device package of claim 9, wherein each of the cavities corresponds to the size of the semiconductor chip covered by the interposer.

11. The semiconductor device package of claim 9, wherein at least one of the cavities further comprises an adhesive material.

12. The semiconductor device package of claim 1, wherein the wire patterns comprise a conductive material.

13. The semiconductor device package of claim 1, further comprising a molding material that seals the stacked semiconductor chips, the interposers, and an upper part of the PCB.

14. The semiconductor device package of claim 13, wherein the molding material is EMC (Epoxy Molding Compound).

15. The semiconductor device package of claim 1, further comprising conductive balls disposed on a lower part of the PCB.

16. An interposer, comprising:
an insulation material;
a wire pattern in the insulation material, the wire pattern comprising:
    lower connection parts configured to be electrically connected to bonding electrodes of a substrate;
    bonding pad connection parts configured to be electrically connected to bonding pads of a semiconductor chip; and
    upper connection parts configured to be electrically connected to another interposer; and
one or more cavities disposed in the insulation material, wherein at least a portion of the bonding pad connection parts is exposed in the cavities, and
wherein the one or more cavities cover a substantially entire upper surface and at least portions of side surfaces of the semiconductor chip.

17. The interposer of claim 16, wherein the one or more cavities comprise a single cavity disposed in a lower part of the insulation material.

18. The interposer of claim 16, wherein the one or more cavities comprise a first cavity disposed in a lower part of the insulation material and a second cavity disposed in an upper part of the insulation material.

19. The interposer of claim 18, wherein the portion of the bonding pad connection parts is only exposed by the first cavity.

20. The interposer of claim 16, further comprising a capping adhesive material disposed in the cavities.

* * * * *